United States Patent
Ma et al.

(10) Patent No.: US 7,175,926 B2
(45) Date of Patent: *Feb. 13, 2007

(54) DUAL-LAYER CARBON-BASED PROTECTIVE OVERCOATS FOR RECORDING MEDIA BY FILTERED CATHODIC ARC DEPOSITION

(75) Inventors: Xiaoding Ma, Fremont, CA (US); Michael Joseph Stirniman, Fremont, CA (US); Jing Gui, Fremont, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 140 days.

This patent is subject to a terminal disclaimer.

(21) Appl. No.: 10/776,191

(22) Filed: Feb. 12, 2004

(65) Prior Publication Data

US 2005/0181238 A1    Aug. 18, 2005

(51) Int. Cl.
    *G11B 5/72*    (2006.01)
(52) U.S. Cl. .................. 428/833.3; 428/216; 428/217; 428/218; 428/825; 204/192.2
(58) Field of Classification Search .............. None
    See application file for complete search history.

(56) References Cited

U.S. PATENT DOCUMENTS

| | | | |
|---|---|---|---|
| 5,279,723 A | 1/1994 | Falabella et al. | |
| 5,282,944 A | 2/1994 | Sanders et al. | |
| 5,580,429 A | 12/1996 | Chan et al. | |
| 5,738,768 A | 4/1998 | Dam et al. | |
| 5,855,746 A | 1/1999 | Prabhakara et al. | |
| 5,945,191 A | 8/1999 | Hwang et al. | |
| 6,027,619 A | 2/2000 | Cathey et al. | |
| 6,136,403 A | 10/2000 | Prabhakara et al. | |
| 6,143,142 A | 11/2000 | Shi et al. | |
| 6,238,780 B1 | 5/2001 | Wu et al. | |
| 6,245,417 B1 | 6/2001 | Huang | |
| 6,565,718 B1 | 5/2003 | Chour et al. | |
| 6,565,719 B1 | 5/2003 | Lairson et al. | |
| 6,613,422 B1 | 9/2003 | Ma et al. | |
| 6,635,156 B1 | 10/2003 | Dodonov et al. | |
| 6,638,608 B1 | 10/2003 | Gui et al. | |
| 6,855,232 B2 * | 2/2005 | Jairson et al. | 204/192.16 |
| 2001/0031382 A1 | 10/2001 | Kusakawa et al. | |
| 2003/0228496 A1* | 12/2003 | Fujimaki et al. | 428/694 TC |

\* cited by examiner

*Primary Examiner*—Kevin M. Bernatz
(74) *Attorney, Agent, or Firm*—McDermott Will & Emery LLP

(57) ABSTRACT

A recording medium, comprising:
(a) a substrate having at least one surface;
(b) a stacked plurality of thin film layers on the at least one surface and including at least one magnetic or magneto-optical (MO) recording layer; and
(c) a protective overcoat layer on an outer surface of an outermost layer of the layer stack, comprising:
(i) a first sub-layer layer ($c_1$) of undoped tetrahedral amorphous carbon (ta-C) formed by filtered cathodic arc deposition (FCAD) on the outer surface of the outermost layer of the stacked plurality of thin film layers and having a high mass density of carbon (C) atoms greater than about 2.5 gms/cm$^3$; and
(ii) a second sub-layer ($c_2$) of nitrogen-doped tetrahedral amorphous carbon (ta-C:N) formed by FCAD on the undoped ta-C layer and having a high mass density of carbon (C) atoms greater than about 2.0 gms/cm$^3$.

20 Claims, 1 Drawing Sheet

DUAL-LAYER CARBON-BASED PROTECTIVE OVERCOATS FOR RECORDING MEDIA BY FILTERED CATHODIC ARC DEPOSITION

FIELD OF THE INVENTION

The present invention relates to a method for forming carbon-based protective overcoat layers having improved corrosion and wear resistance, and to improved magnetic and MO recording media including an ultra-thin, carbon-based protective overcoat layer formed according to the inventive methodology. The present invention is particularly useful in the manufacture of very high areal recording density magnetic media utilized with read/write transducers operating at very low flying heights.

BACKGROUND OF THE INVENTION

A magnetic recording medium, e.g., a hard disk, typically comprises a laminate of several layers, comprising a non-magnetic substrate, such as of Al—Mg alloy or a glass or glass-ceramic composite material, and formed sequentially on each side thereof, a polycrystalline underlayer, typically of chromium (Cr) or Cr-based alloy, a polycrystalline magnetic recording medium layer, e.g., of a cobalt (Co)-based alloy, a hard, abrasion-resistant, protective overcoat layer, typically containing carbon (C), and a lubricant topcoat.

In operation of the recording medium, the polycrystalline magnetic recording medium layer is locally magnetized by a write transducer, or write head, to record and store information. The write transducer creates a highly concentrated magnetic field which alternates direction based on the bits of information being stored. When the local magnetic field produced by the write transducer is greater than the coercivity of the recording medium layer, then the grains of the polycrystalline recording medium at that location are magnetized. The grains retain their magnetization after the magnetic field produced by the write transducer is removed. The direction of the magnetization matches the direction of the applied magnetic field. The magnetization of the polycrystalline recording medium can subsequently produce an electrical response in a read transducer, allowing the stored information to be read.

Thin film magnetic recording media are conventionally employed in disk form for use with disk drives for storing large amounts of data in magnetizable form. Typically, one or more disks are rotated on a central axis in combination with data transducer heads. In operation, a typical contact start/stop (CSS) method commences when the head begins to slide against the surface of the disk as the disk begins to rotate. Upon reaching a predetermined high rotational speed, the head floats in air at a predetermined distance from the surface of the disk due to dynamic pressure effects caused by air flow generated between the sliding surface of the head and the disk. During reading and recording operations, the transducer head is maintained at a controlled distance from the recording surface, supported on a bearing of air as the disk rotates, such that the head can be freely moved in both the circumferential and radial directions, allowing data to be recorded on and retrieved from the disk at a desired position. Upon terminating operation of the disk drive, the rotational speed of the disk decreases and the head again begins to slide against the surface of the disk and eventually stops in contact with and pressing against the disk. Thus, the transducer head contacts the recording surface whenever the disk is stationary, accelerated from the static position, and during deceleration just prior to completely stopping. Each time the head and disk assembly is driven, the sliding surface of the head repeats the cyclic sequence consisting of stopping, sliding against the surface of the disk, floating in the air, sliding against the surface of the disk, and stopping.

As a consequence of the above-described cyclic CSS-type operation, the surface of the disk or medium surface wears off due to the sliding contact if it has insufficient abrasion resistance or lubrication quality, resulting in breakage or damage if the medium surface wears off to a great extent, whereby operation of the disk drive for performing reading and reproducing operations becomes impossible. The protective overcoat layer is formed on the surface of the polycrystalline magnetic recording medium layer so as to protect the latter from friction and like effects due to the above-described sliding action of the magnetic head. Abrasion-resistant, carbon (C)-containing protective coatings have been utilized for this purpose, and are typically formed by sputtering of a carbon target in an argon (Ar) atmosphere. Such amorphous carbon (a-C)-containing protective overcoat layers formed by sputtering have relatively strong graphitic-type bonding, and therefore exhibit a low coefficient of friction in atmospheres containing water ($H_2O$) vapor, which characteristic is peculiar to graphite. However, the a-C layers produced in such manner have very low hardness as compared with many ceramic materials such as are employed as slider materials of thin film heads, and thus are likely to suffer from wear due to contact therewith.

In recent years, therefore, carbon-based protective overcoat layers having diamond-like hardness properties (i.e., HV of about 1,000–5,000 $kg/mm^2$) have been developed, and films of diamond-like carbon (DLC) having a high percentage of diamond-type C—C bonding have been utilized. Such DLC films exhibit a high degree of hardness due to their diamond-like sp bonding structure, and in addition, exhibit the excellent sliding properties characteristic of carbon, thus affording improved sliding resistance against sliders composed of high hardness materials. Such DLC films are generally obtained by DC or RF magnetron sputtering of a carbon target in a gas atmosphere comprising a mixture of Ar gas and a hydrocarbon gas, e.g., methane, or hydrogen gas. The thus-obtained films exhibit DLC properties when a fixed amount of hydrogen is incorporated therein. Incorporation of excessive amounts of hydrogen in the films leads to gradual softening, and thus the hydrogen content of the films must be carefully regulated.

Amorphous, hydrogenated carbon films (referred to herein as a-C:H films) obtained by sputtering of carbon targets in an Ar+$H_2$ gas mixture exhibiting diamond-like properties have also been developed for improving the tribological performance of disk drives; however, the electrical insulating properties of such type films lead to undesirable electrical charge build-up or accumulation during hard disk operation which can result in contamination, glide noise, etc. In order to solve this problem without sacrifice or diminution of the advantageous mechanical properties of such a-C:H films, attempts have been made to form bi-layer structures including a lower C:H overcoat layer and an upper, nitrogen-containing C:H overcoat layer, or to dope or otherwise incorporate nitrogen (N) atoms into the surface of a C:H protective overcoat, in order to decrease the electrical resistivity thereof and/or to provide increased bonding of the lubricant topcoat layer to the protective overcoat layer.

However, the continuous increase in areal recording density of magnetic recording media requires read/write transducers operating at a commensurately lower flying height. Therefore, further reduction of the thickness of the carbon-based protective overcoat layer without adverse consequences is desirable. Conventional sputtered a-C:H materials are difficult to uniformly deposit and generally do not function satisfactorily at a thickness of about 30 Å or less. Specifically, conventional sputtered a-C:H films of about 30 Å thickness fail to provide adequate protection against corrosion of the underlying magnetic layer(s), particularly Co-containing ferromagnetic layers, when under environments of high temperature and humidity, and the resulting corrosion product(s) frequently are disadvantageously transferred to the transducer heads, often leading to failure of the disk drive.

The use of alternative deposition techniques for developing thinner, harder, and more dense C:H layers having the requisite mechanical and tribological properties has been studied, such as plasma enhanced chemical vapor deposition (PECVD), ion beam deposition (IBD), and filtered cathodic arc deposition (FCAD) techniques. For example, the IBD method can be utilized for forming high carbon density, hydrogenated carbon films (referred to herein as I—C:H films) that exhibit superior tribological performance at thicknesses below about 100 Å.

As indicated supra, the continuous increase in areal recording density of disk-type recording media has necessitated development of even thinner carbon-based protective overcoat layers than heretofore utilized, e.g., <~30 Å thick, which thin overcoat layers are still required to protect the media from both tribological (i.e., mechanical) and chemical degradation. It is considered that overcoat layers with an increased density of carbon (C) atoms vis-à-vis conventional carbon-based protective overcoat materials are required for such high areal recording density media.

Filtered cathodic arc deposition (FCAD) is an attractive candidate for providing carbon-based protective overcoat layers with the requisite high carbon atom density and can be implemented in a cost-effective manner. For example, as shown in graphical form in FIG. 1, DLC protective overcoat layers comprised of tetrahedral amorphous carbon (ta-C) produced by FCAD are of significantly greater mass density than other types or forms of DLC, such as a-C:H formed by sputtering and I—C:H formed by ion beam deposition (IBD). However, since the ta-C films produced by FCAD do not contain either hydrogen (H) or nitrogen (N) atoms, and are highly sp bonded, their population of dangling bonds is very high, resulting in very high surface energy. The latter characteristic in turn disadvantageously engenders issues related to deleterious interactions between the carbon atoms and lubricant topcoat molecules, e.g., resulting in a higher than expected (or desired) bonded lubricant ratio leading to poor durability of the head-disk interfaces.

Accordingly, there exists a need for an improved hard, abrasion and corrosion-resistant, high carbon density ta-C protective overcoat material such as is formed by FCAD, which is particularly suitable for use as ultra-thin (i.e., <30 Å thick) protective overcoat layers in high areal density magnetic recording media utilized with read/write transducers operating at extremely low flying heights, and a method for manufacturing same, which method is simple, cost-effective, and fully compatible with the productivity and throughput requirements of automated manufacturing technology.

The present invention fully addresses and solves the above-described problems attendant upon the formation of ultra-thin, abrasion and corrosion-resistant, high carbon density ta-C protective overcoat layers formed by FCAD and suitable for use with high areal density magnetic recording media, such as are employed in hard drive applications, while maintaining full compatibility with all mechanical and electrical aspects of conventional disk drive technology. In addition, the present invention enjoys utility in the formation of ultra-thin, abrasion and corrosion-resistant protective overcoat layers required in the manufacture and use of thin film-based, ultra-high recording density magneto-optical (MO) data/information storage and retrieval media in disk form and utilizing conventional Winchester disk drive technology with laser/optical-based read/write transducers operating at flying heights on the order of a few micro-inches above the media surface.

DISCLOSURE OF THE INVENTION

An advantage of the present invention is an improved method of forming a layer of a hard, dense, abrasion and corrosion resistant, high mass density tetrahedral amorphous carbon-containing material on a surface of a substrate by means of filtered cathodic arc deposition (FCAD).

Another advantage of the present invention is an improved method of forming a protective overcoat layer on a magnetic or magneto-optical (MO) recording medium, comprising a hard, dense, abrasion and corrosion resistant, high mass density tetrahedral amorphous carbon-containing material formed by filtered cathodic arc deposition (FCAD).

Yet another advantage of the present invention is a magnetic or magneto-optical (MO) recording medium, comprising an improved protective overcoat layer including a novel hard, dense, abrasion and corrosion resistant, high mass density tetrahedral amorphous carbon-containing material formed by filtered cathodic arc deposition (FCAD).

Still another advantage of the present invention is a novel hard, dense, abrasion and corrosion resistant tetrahedral amorphous carbon-containing material useful in forming a protective overcoat layer for a magnetic or magneto-optical (MO) recording medium.

Additional advantages and other features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to one aspect of the present invention, the foregoing and other advantages are obtained in part by a method of forming a layer of a hard, dense, and abrasion and corrosion resistant material on a surface of a substrate, comprising sequential steps of:

(a) providing a substrate having at least one surface adapted for deposition thereon;

(b) forming on the at least one surface of the substrate a layer of undoped tetrahedral amorphous carbon (ta-C) having a high mass density of carbon (C) atoms greater than about 2.5 gms/cm$^3$; and (c) forming on the layer of undoped ta-C a layer of nitrogen-doped tetrahedral amorphous carbon (ta-C:N) having a high mass density of carbon (C) atoms greater than about 2.0 gms/cm$^3$.

According to preferred embodiments of the present invention, step (c) comprises forming the nitrogen-doped layer of ta-C:N with a nitrogen-to-carbon atom ratio (N/C) of up to about 0.3; step (b) comprises forming the layer of undoped ta-C by means of a filtered cathodic arc deposition (FCAD) process performed in a processing (vacuum) chamber and utilizing an undoped carbon cathode; step (c) comprises forming the nitrogen-doped layer of ta-C:N by means of a FCAD process utilizing the undoped carbon cathode and with a nitrogen-containing gas introduced to the vacuum chamber, e.g., at a flow rate up to about 100 sccm; step (a) comprises providing a disk-shaped substrate including a stacked plurality of thin film layers on at least one surface thereof, the layers including at least one magnetic or magneto-optical (MO) recording layer; and step (b) comprises forming the layer of undoped ta-C on an exposed surface of an outermost layer of the stacked plurality of layers.

Embodiments of the present invention include those wherein step (b) comprises forming the layer of undoped ta-C at a thickness from about 1 to about 100 Å, preferably from about 5 to about 30 Å; and step (c) comprises forming the layer of nitrogen-doped ta-C:N at a thickness from about 1 to about 50 Å, preferably from about 5 to about 20 Å.

Other preferred embodiments of the invention include those wherein steps (b) and (c) together form a layer of the hard, dense, and abrasion and corrosion resistant material having a combined thickness from about 10 to about 50 Å.

Another aspect of the present invention is a recording medium, comprising:

(a) a substrate having at least one surface;

(b) a stacked plurality of thin film layers on the at least one surface, the layers including at least one magnetic or magneto-optical (MO) recording layer; and (c) a protective overcoat layer on an outer surface of an outermost layer of the stacked plurality of thin film layers, wherein the protective overcoat layer comprises:

(i) a first sub-layer layer ($c_1$) of undoped tetrahedral amorphous carbon (ta-C) on the outer surface of the outermost layer of the stacked plurality of thin film layers and having a high mass density of carbon (C) atoms greater than about 2.5 gms/cm$^3$; and (ii) a second sub-layer ($c_2$) of nitrogen-doped tetrahedral amorphous carbon (ta-C:N) on the undoped ta-C layer and having a high mass density of carbon (C) atoms greater than about 2.0 gms/cm$^3$.

According to embodiments of the present invention, the second sub-layer ($c_2$) of ta-C:N preferably has a nitrogen-to-carbon atom ratio (N/C) of up to about 0.3; the first sub-layer ($c_1$) of undoped ta-C has a thickness from about 1 to about 100 Å, preferably from about 5 to about 30 Å; and the second sub-layer ($c_2$) has a thickness from about 1 to about 50 Å, preferably from about 5 to about 20 Å.

Preferred embodiments of the invention include those wherein the protective overcoat layer (c) has a combined thickness of the first and second sub-layers ($c_1+c_2$) from about 10 to about 50 Å.

Yet another aspect of the present invention is a hard, dense, and abrasion and corrosion resistant material useful in forming a protective overcoat layer for a magnetic or magneto-optical recording medium, which material comprises:

(a) a first region of undoped tetrahedral amorphous carbon (ta-C) having a high mass density of carbon (C) atoms greater than about 2.5 gms/cm$^3$; and (b) a second region of nitrogen-doped tetrahedral amorphous carbon (ta-C:N) having a high mass density of carbon (C) atoms greater than about 2.0 gms/cm$^3$.

According to preferred embodiments of the present invention, the nitrogen-to-carbon ratio (N/C) of the second region is up to about 0.3; the first region forms a first sub-layer and the second region forms a second sub-layer stacked on the first sub-layer, wherein the first sub-layer is from about 1 to about 100 Å thick, preferably from about 5 to about 30 Å thick, the second sub-layer is from about 1 to about 50 Å thick, preferably from about 5 to about 20 Å thick; and the first and second sub-layers have a combined thickness from about 10 to about 50 Å.

Further embodiments of the present invention include a recording medium comprising a stack of thin film layers on a substrate and the first sub-layer of the above-described material formed in contact with an outermost layer of the stack.

Additional advantages and aspects of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, wherein.

DESCRIPTION OF THE INVENTION

Figure 1:
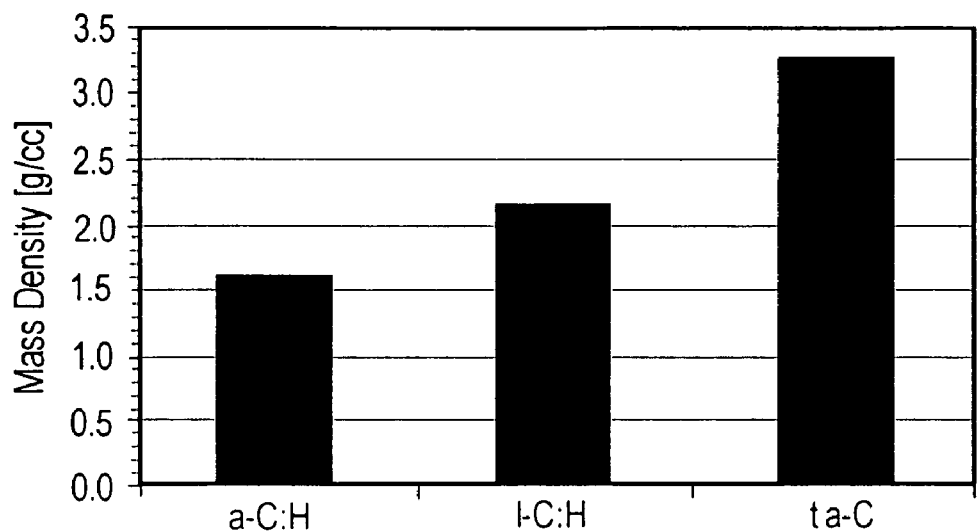
FIG. 1 is a bar graph for illustrating the carbon atom density of different types of carbon-based materials useful in forming protective overcoat layers on recording media.

The present invention addresses and solves problems attendant upon the formation of ultra-thin, abrasion and corrosion-resistant protective overcoat layers suitable for use with high areal density magnetic recording media, such as are employed in hard drive applications, while maintaining full compatibility with all mechanical and electrical aspects of conventional disk drive technology. In addition, the present invention enjoys utility in the formation of ultra-thin, abrasion and corrosion-resistant protective overcoat layers required in the manufacture and use of thin film-based, ultra-high recording density magneto-optical (MO) data/information storage and retrieval media in disk form and utilizing conventional Winchester disk drive technology with laser/optical-based read/write transducers operating at flying heights on the order of a few micro-inches above the media surface.

Specifically, the present invention is based upon recognition by the inventors that novel hard, abrasion and corrosion-resistant tetrahedral amorphous carbon (ta-C) films and layers having high carbon atom densities, suitable for use as ultra-thin, protective overcoat layers of thin film magnetic and MO recording media, and exhibiting superior properties vis-à-vis C-containing protective overcoat films and layers obtained by conventional techniques, can be rapidly, conveniently, and cost-effectively formed by a process involving formation of a first, undoped ta-C region or sub-layer adjacent the recording media surface by a filtered cathodic arc deposition (FACD) process, followed by formation of a second, nitrogen-doped ta-C:N outer region or sub-layer over the first, undoped ta-C region or sub-layer by a FACD process. Since the second, nitrogen-doped ta-C:N region or sub-layer has a lower amount of dangling bonds than the first, undoped ta-C region or sub-layer and thus is passivated, the nitrogen doping of the outer region or sub-layer improves interaction between the protective overcoat layer and the subsequently applied lubricant topcoat, thereby providing the resultant media with advantageous tribological and corrosion resistance properties. In addition, according to the inventive methodology any deleterious effects on the properties of the recording layer of the media, e.g., a magnetic recording layer, caused by the presence of the nitrogen atoms in the protective overcoat layer, are effectively avoided or eliminated by use of the dual-layer structure wherein the ta-C layer in immediate contact with the recording layer stack is free of nitrogen, i.e., undoped.

More specifically, according to the inventive methodology the undoped tetrahedral amorphous carbon (ta-C) material having a high carbon density greater than about 2.5 gm/cm$^3$ is initially formed as a first thin region or sub-layer on a workpiece surface (typically a recording medium comprised of a stack of thin film layers formed on a substrate surface) and having a thickness from about 1 to about 100 Å, preferably from about 5 to about 30 Å, by means of a filtered cathodic arc deposition (FCAD) process comprising generation and deposition of high energy (e.g., 30–40 ev) C ions and ion clusters. Formation of the first, undoped ta-C region or sub-layer is then followed by formation thereon of a nitrogen-doped tetrahedral amorphous carbon (ta-C:N) second thin region or sub-layer having a thickness from about 1 to about 50 Å, preferably from about 5 to about 20 Å. The combined thickness of the first and second regions or sub-layers when utilized as a protective overcoat layer for disk type media is typically in the range from about 10 to 50 Å, facilitating obtainment of ultra-high areal recording densities when employed in disk drive systems with transducer heads operating at very low flying heights, e.g., from about 0.2 to about 0.5 μinch.

As indicated above, the present invention relies upon use of filtered cathodic arc deposition (FCAD) technology for forming hard, abrasion and corrosion resistant layers on substrate/workpiece surfaces, e.g., protective overcoat layers on disk-shaped magnetic and magneto-optical recording media, with very high carbon atom densities (i.e., exceeding 2.5 gm/cm$^3$) not obtainable with conventional methodologies for formation of diamond-like carbon (DLC) materials. Specifically, and with reference to FIG. 1, which is a bar graph illustrating the carbon atom density of different types of carbon-based materials useful in forming protective overcoat layers on recording media, it is evident that the >2.5 gm/cm$^3$ C-atom density of tetrahedral amorphous carbon (ta-C) formed by FCAD is significantly greater than that of DLC-based protective overcoat layers formed by several commonly utilized DLC deposition techniques, e.g., ~1.5 gm/cm$^3$ for I—C:H formed by ion beam deposition (IBD) and ~2.0 gm/cm$^3$ for a-C:H formed by sputtering or plasma-enhanced chemical vapor deposition (PECVD. As a consequence of their greater C atom density, FCAD ta-C layers offer possible utility as protective overcoat layers providing increased tribological (mechanical) and corrosion/environmental protection of disk-type recording media.

Filtered cathodic arc deposition (FCAD) techniques involve generation of a relatively narrow, high intensity beam of plasma containing particles (including ions and ion clusters) of a coating material derived from a source of the coating material, i.e., a cathode subjected to a high intensity arc discharge, as for example, disclosed in U.S. Pat. Nos. 5,279,723; 6,027,619; 6,236,543 B1; and 6,506,292 B2, the entire disclosures of which are incorporated herein by reference. According to FCAD technology, particles exceeding a selected mass are removed from the plasma beam via a filtering means, in order to eliminate deposition of globules of coating material on the substrate surface.

The inventive methodology will now be demonstrated by reference to the following illustrative, but not limitative examples, wherein undoped ta-C first sub-layers are initially formed on substrates/workpieces (in the form of disk-shaped recording media comprised of a stack of thin film layers including at least one magnetic or magneto-optical (MO) recording layer) in the processing (i.e., vacuum) chamber of a FCAD apparatus. Operating conditions include providing the FCAD chamber with a pure (i.e., undoped) carbon cathode, initial pump-down of the chamber to a base pressure <1×10$^{-6}$ Torr, striking a 20–40 A arc between the cathode and an anode to generate a plasma beam containing carbon particles and particle clusters, including ionized particles, filtering macro-particles from the plasma beam, and directing the filtered plasma beam of 30–40 eV C ion energy onto the outermost layer of the recording media layer stack to effect deposition of a first, undoped ta-C sub-layer thereon. As indicated supra, the thickness of the first, undoped ta-C sub-layer is from about 1 to about 100 Å, preferably from about 5 to about 30 Å.

Upon completion of formation of the first, undoped ta-C sub-layer to the desired thickness, nitrogen (N$_2$) gas is introduced into the processing (vacuum) chamber of the FCAD apparatus at a selected flow rate (i.e., up to about 100 sccm) in order to form the second, nitrogen-doped ta-C:N sub-layer on and in contact with the first, undoped ta-C layer. The operating conditions of the FCAD apparatus are otherwise unchanged. As indicated supra, the thickness of the second, nitrogen-doped ta-C:N sub-layer is from about 1 to about 50 Å, preferably from about 5 to about 20 Å, and the combined thickness of the first, undoped and second, nitrogen-doped sub-layers when utilized as a protective overcoat layer for disk type media typically is in the range from about 10 to 50 Å.

Figure 2:
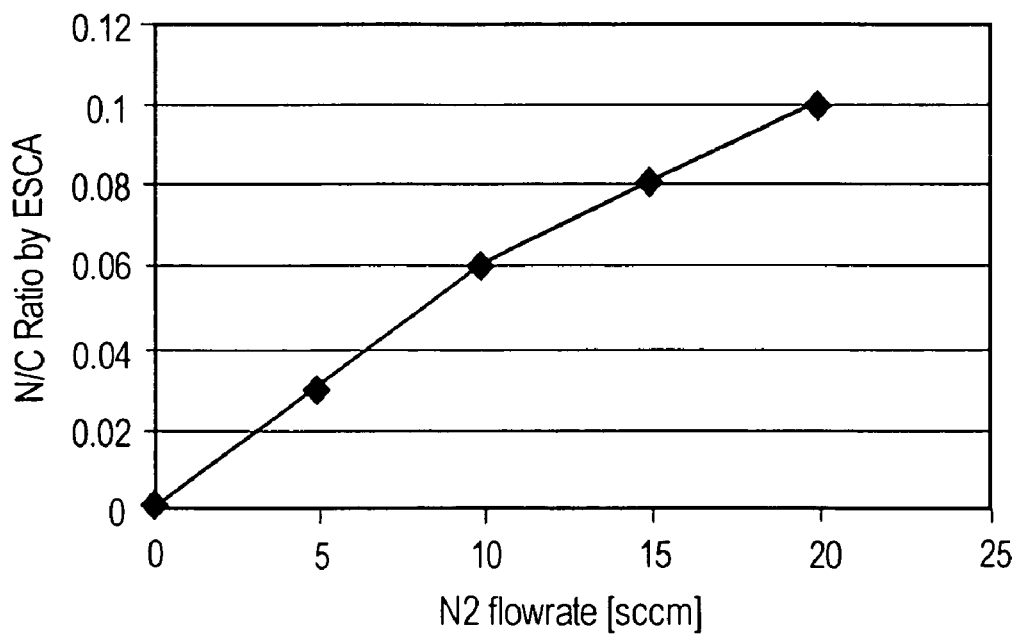
FIG. 2 is a graph for illustrating the variation of nitrogen-to-carbon atom ratio (N/C) of nitrogen-doped tetrahedral amorphous carbon (ta-C:N) films or layers formed by filtered cathodic arc deposition (FCAD), as a function of the flow rate of N$_2$ gas into the processing chamber of the FCAD apparatus, as determined by ESCA.

Referring now to FIG. 2, shown therein is a graph illustrating the variation of nitrogen-to-carbon atom (N/C) ratio (as determined by ESCA) of the second, nitrogen-doped tetrahedral amorphous carbon (ta-C:N) sub-layers formed by filtered cathodic arc deposition (FCAD), as a function of the flow rate of N$_2$ gas into the processing chamber of the FCAD apparatus. As is evident from FIG. 2, the N/C ratio increases with increased N$_2$ flow rate. The result clearly indicates that FCAD ta-C can be readily doped with N atoms by introduction of N$_2$ (or other nitrogen-containing gas) into the FCAD processing chamber. In addition, dual carbon layer FCAD structures, such as the illustrated (ta-C/ta-C:N), can be fabricated by delaying introduction of the N$_2$ (or other) gas into the FCAD processing chamber until formation of the first (or lower or inner), undoped ta-C sub-layer is complete. The N/C ratio and thickness of the second (or upper or outer), nitrogen-doped ta-C:N sub-layer can be controlled by regulating the duration and rate of the N$_2$ gas flow. For example, in the illustrated example the N/C ratio of the resultant combined protective overcoat film or layer varies between 0 (at the interface of the first, undoped ta-C layer and the surface of the outermost layer of the layer stack of the media) and 0.1 (at the outer surface of the second, nitrogen-doped ta-C:N layer) for the N$_2$ flow rate of 20 sccm.

Thus, according to the inventive methodology, the requirements for an ideal protective overcoat layer structure for recording media, i.e., a very high C atom density, undoped ta-C stratum or layer adjacent the layer stack of the recording medium and an N-doped surface stratum for obtaining optimal bonded lubricant ratios, are satisfied.

The present invention therefore provides a number of advantages over the conventional IBD, sputtered, or PECVD DLC materials, films, and layers currently available for use as abrasion and corrosion-resistant protective overcoat layers for magnetic and MO recording media, such as hard disks. More specifically, the high carbon atom density ta-C/ta-C:N dual-layer films according to the present invention provide enhanced tribological properties, reduced corrosion, and optimized bonded lubricant ratios for self-replenishing CSS operation at ultra-thin thicknesses (i.e., ~30 Å), and thus are eminently suitable for use in the manufacture of very high areal recording density media and devices therefor requiring operation of read/write transducers at extremely low flying heights. In addition, the inventive means and methodology are fully compatible with all other aspects of automated manufacture of magnetic and MO media and are useful in a variety of other industrially significant applications, including, but not limited to, formation of hard, abrasion and corrosion resistant coatings useful in the manufacture of tools, bearings, turbines, etc.

In the previous description, numerous specific details are set forth, such as specific materials, structures, reactants, processes, etc., in order to provide a better understanding of the present invention. However, the present invention can be practiced without resorting to the details specifically set forth. In other instances, well-known processing materials and techniques have not been described in detail in order not to unnecessarily obscure the present invention.

Only the preferred embodiments of the present invention and but a few examples of its versatility are shown and described in the present disclosure. It is to be understood that the present invention is capable of use in other combinations and environments and is susceptible of changes and/or modifications within the scope of the inventive concept as expressed herein.

What is claimed is:

1. A method of forming a layer of a hard, dense, and abrasion and corrosion resistant material on a surface of a substrate, comprising sequential steps of:
   (a) providing a substrate having at least one surface adapted for deposition thereon;
   (b) forming on said at least one surface of said substrate a layer of undoped tetrahedral amorphous carbon (ta-C) having a high mass density of carbon (C) atoms greater than about 2.5 gms/cm$^3$; and
   (c) forming on said layer of undoped ta-C a layer of nitrogen-doped tetrahedral amorphous carbon (ta-C:N) having a high mass density of carbon (C) atoms greater than 2.0 gms/cm$^3$.

2. The method according to claim 1, wherein:
step (c) comprises forming said nitrogen-doped layer of ta-C:N with a nitrogen-to-carbon atom ratio (N/C) of up to about 0.3.

3. The method according to claim 2, wherein:
step (b) comprises forming said layer of undoped ta-C by means of a filtered cathodic arc deposition (FCAD) process performed in a vacuum chamber and utilizing an undoped carbon cathode; and
step (c) comprises forming said nitrogen-doped layer of ta-C:N by means of a FCAD process utilizing said undoped carbon cathode and a nitrogen-containing gas introduced to said vacuum chamber.

4. The method according to claim 3, wherein:
step (c) comprises introducing nitrogen gas ($N_2$) to said vacuum chamber at a flow rate up to about 100 sccm.

5. The method according to claim 3, wherein:
step (a) comprises providing a disk-shaped substrate including a stacked plurality of thin film layers on at least one surface thereof, said layers including at least one magnetic or magneto-optical (MO) recording layer; and
step (b) comprises forming said layer of undoped ta-C on an exposed surface of an outermost layer of said stacked plurality of layers.

6. The method according to claim 5, wherein:
step (b) comprises forming said layer of undoped ta-C at a thickness from about 1 to about 100 Å; and
step (c) comprises forming said layer of nitrogen-doped ta-C:N at a thickness from about 1 to about 50 Å.

7. The method according to claim 6, wherein:
step (b) comprises forming said layer of undoped ta-C at a thickness from about 5 to about 30 Å; and
step (c) comprises forming said layer of nitrogen-doped ta-C:N at a thickness from about 5 to about 20 Å.

8. The method according to claim 5, wherein:
steps (b) and (c) together form a layer of said hard, dense, and abrasion and corrosion resistant material having a combined thickness from about 10 to about 50 Å.

9. A recording medium, comprising:
(a) a substrate having at least one surface;
(b) a stacked plurality of thin film layers on said at least one surface thereof, said layers including at least one magnetic or magneto-optical (MO) recording layer; and
(c) a protective overcoat layer on an outer surface of an outermost layer of said stacked plurality of thin film layers, wherein said protective overcoat layer comprises:
   (i) a first sub-layer layer ($c_1$) of undoped tetrahedral amorphous carbon (ta-C) on said outer surface of said outermost layer of said stacked plurality of thin film layers and having a high mass density of carbon (C) atoms greater than about 2.5 gms/cm$^3$; and
   (ii) a second sub-layer ($c_2$) of nitrogen-doped tetrahedral amorphous carbon (ta-C:N) on said undoped ta-C layer and having a high mass density of carbon (C) atoms greater than 2.0 gms/cm$^3$.

10. The recording medium as in claim 9, wherein:
said second sub-layer ($c_2$) of ta-C:N has a nitrogen-to-carbon atom ratio (N/C) of up to about 0.3.

11. The recording medium as in claim 10, wherein:
said first sub-layer ($c_1$) of undoped ta-C has a thickness from about 1 to about 100 Å; and
said second sub-layer ($c_2$) has a thickness from about 1 to about 50 Å.

12. The recording medium as in claim 11, wherein:
said first sub-layer ($c_1$) of undoped ta-C has a thickness from about 5 to about 30 Å; and
said second sub-layer ($c_2$) has a thickness from about 5 to about 20 Å.

13. The recording medium as in claim 10, wherein:
said protective overcoat layer (c) has a combined thickness of said first and second sub-layers ($c_1+c_2$) from about 10 to about 50 Å.

14. A hard, dense, and abrasion and corrosion resistant material useful in forming a protective overcoat layer for a magnetic or magneto-optical recording medium, which material comprises:

(a) a first region of undoped tetrahedral amorphous carbon (ta-C) having a high mass density of carbon (C) atoms greater than about 2.5 gms/cm$^3$; and
(b) a second region of nitrogen-doped tetrahedral amorphous carbon (ta-C:N) having a high mass density of carbon (C) atoms greater than 2.0 gms/cm$^3$.

15. The material according to claim 14, wherein the nitrogen-to-carbon ratio (N/C) of said second region is up to about 0.3.

16. The material according to claim 15, wherein:
said first region forms a first sub-layer; and
said second region forms a second sub-layer stacked on said first sub-layer.

17. The material according to claim 16, wherein:
said first sub-layer is from about 1 to about 100 Å thick; and
said second sub-layer is from about 1 to about 50 Å thick.

18. The material according to claim 17, wherein:
said first sub-layer is from about 5 to about 30 Å thick; and
said second sub-layer is from about 5 to about 20 Å thick.

19. The material according to claim 16, wherein:
said first and second sub-layers have a combined thickness from about 10 to about 50 Å.

20. A recording medium comprising a stack of thin film layers on a substrate and a protective overcoat layer formed of a hard, dense, and abrasion and corrosion resistant material, which material comprises:
(a) a first region of undoped tetrahedral amorphous carbon (ta-C) having a high mass density of carbon (C) atoms greater than about 2.5 gms/cm$^3$; and
(b) a second region of nitrogen-doped tetrahedral amorphous carbon (ta-C:N) having a high mass density of carbon (C) atoms greater than 2.0 gms/cm$^3$;
wherein the nitrogen-to-carbon ratio (N/C) of said second region is up to about 0.3,
said first region forms a first sub-layer, and
said second region forms a second sub-layer stacked on said first sub-layer; and said first sub-layer is formed in contact with an outermost layer of said stack.

* * * * *